United States Patent
Chiou

[11] Patent Number: 5,867,365
[45] Date of Patent: Feb. 2, 1999

[54] CPU HEAT SINK ASSEMBLY

[76] Inventor: Ming Chin Chiou, No. 2, Alley 1, Lane 160, Kai De St., Chien Chen Chu, Kau Hsiung City, Taiwan

[21] Appl. No.: 872,166

[22] Filed: Jun. 10, 1997

[51] Int. Cl.⁶ ................................................ H05K 7/20
[52] U.S. Cl. ..................... 361/690; 361/697; 361/704; 361/757; 165/80.3; 165/80.4; 165/185
[58] Field of Search ................................ 165/121, 80.3; 361/697, 687, 695

[56] References Cited

U.S. PATENT DOCUMENTS 5,584,339  12/1996  Hong ........................................ 165/80.3
5,661,638  8/1997  Mira ......................................... 361/697
5,727,624  3/1998  Ko et al. ................................... 165/121

*Primary Examiner*—Leo P. Picard
*Attorney, Agent, or Firm*—Bacon & Thomas, PLLC

[57] ABSTRACT

A CPU heat sink including a heat sink body and a cover plate covered on the heat sink body, the heat sink body having a circular recessed chamber at an eccentric location which receives a fan, and a plurality of radiating fins spirally arranged around the circular recessed chamber and defining a plurality of spiral air passages adapted for guiding currents of air out of the circular recessed chamber, the cover plate having a circular opening corresponding to the circular recessed chamber of the heat sink body, rows of air vents, and a plurality of sloping wind guide strips respectively projecting into the air vents for guiding outside air through the air vents into the spiral air passages of the heat sink body.

1 Claim, 4 Drawing Sheets

CPU HEAT SINK ASSEMBLY

BACKGROUND OF THE INVENTION

The present invention relates to CPU heat sinks, and more particularly to such a CPU heat sink assembly which has spiral air passages and air vents for convection.

When a CPU of a computer is operated, it produces heat. If heat is not quickly carried away from the CPU, the function of the CPU may be affected. A variety of heat sinks have been disclosed for this purpose. These heat sinks may be mounted with a fan on the inside for quick dissipation of heat. However, these heat sinks cannot achieve a satisfactory heat dissipation result because they commonly have only one opening right above the fan for convection.

SUMMARY OF THE INVENTION

According to one aspect of the present invention, the CPU heat sink assembly comprises a heat sink body and a cover plate covered on the heat sink body, wherein the heat sink body has a circular recessed chamber at an eccentric location which receives a fan, and a plurality of radiating fins spirally arranged around the circular recessed chamber and defining a plurality of spiral air passages adapted for guiding currents of air out of the circular recessed chamber; the cover plate has a circular opening corresponding to the circular recessed chamber of the heat sink body through which outside air is drawn into the circular recessed chamber and then driven out of the heat sink body through the radial air passages. According to another aspect of the present invention, the cover plate has rows of air vents, and a plurality of sloping wind guide strips respectively projecting into the air vents for guiding outside air through the air vents into the spiral air passages of the heat sink body.

DETAILED DESCRIPTION OF THE PREFERRED EMBODIMENT

Figure 1:
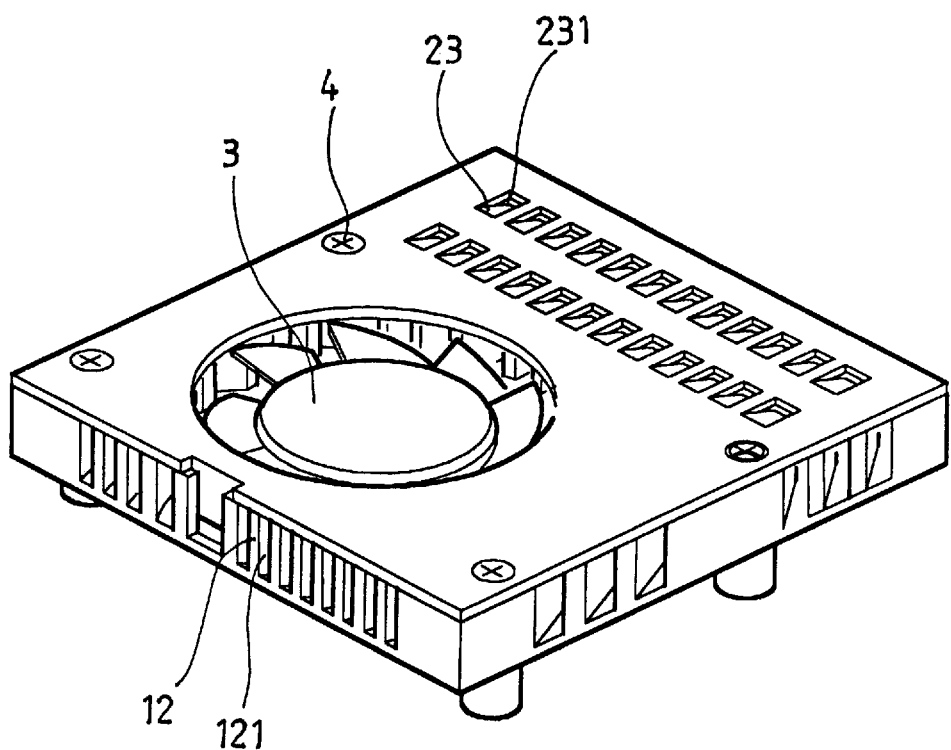
FIG. 1 is a perspective an elevational view of a CPU heat sink assembly according to the present invention.
Figure 2:
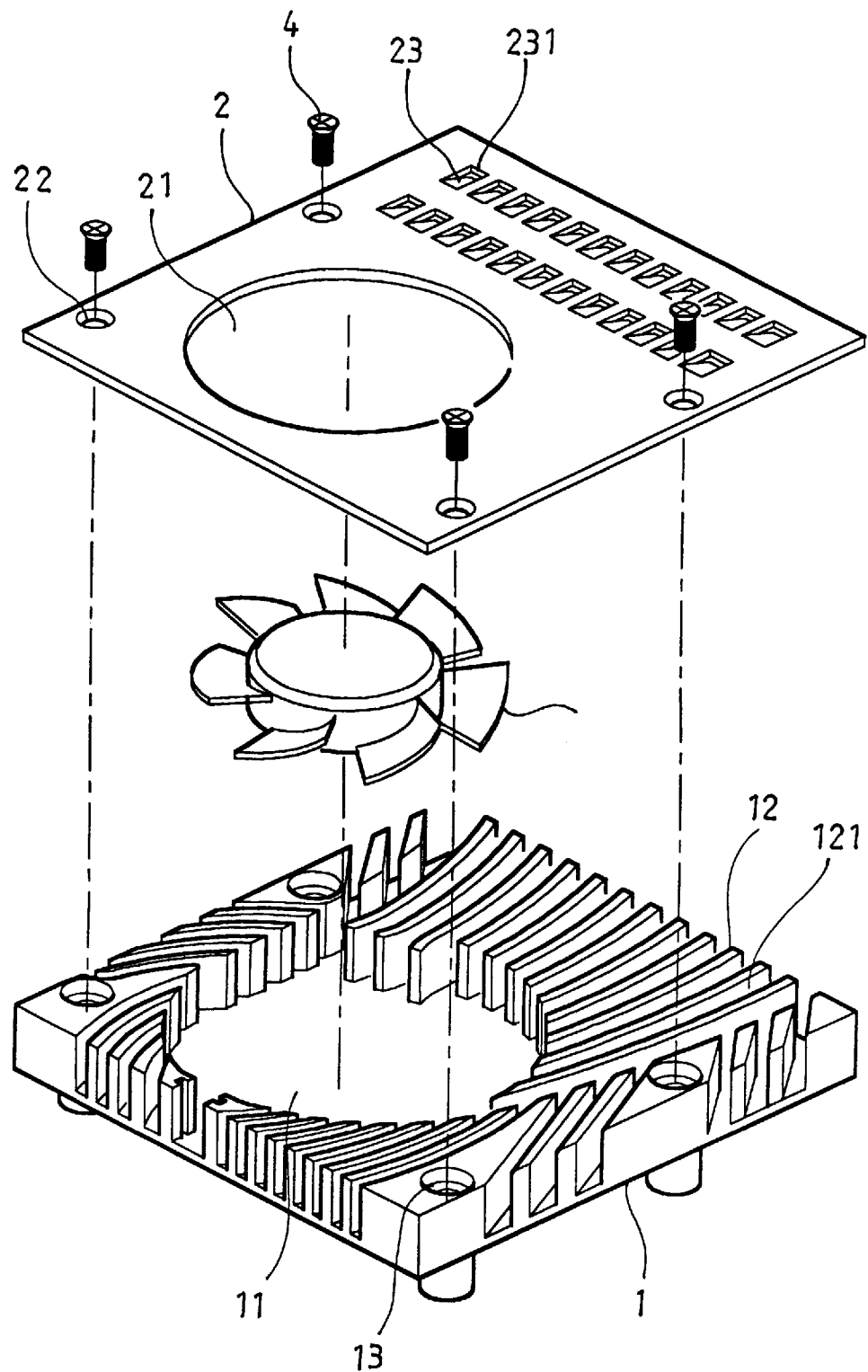
FIG. 2 is an exploded view of FIG. 1.

Referring to FIGS. 1 and 2, a CPU heat sink assembly in accordance with the present invention is generally comprised of a heat sink body 1, and a cover plate 2. The heat sink body 1 comprises a circular recessed chamber 11 at a top side thereof at an eccentric location adapted for receiving a fan 3, a plurality of mounting holes 13 arranged near two opposite side edges thereof, and a plurality of radiating fins 12 spirally arranged around the circular recessed chamber 11 and defining a plurality of spiral air passages 121 adapted for guiding currents of air out of the circular recessed chamber 11. The cover plate 2 fits over the heat sink body 1, having a circular opening 21 corresponding to the circular recessed chamber 11, a plurality of countersunk holes 22 corresponding to the mounting holes 13 of the heat sink body 1, rows of air vents 231, and a plurality of sloping wind guide strips 23, each strip 23 respectively projecting downwardly into an air vent 231 for guiding outside air through the air vents 231 and into the spiral air passages 121 of the heat sink body 1. The air vent 231 are aligned with the spiral air passages 121. When the fan 3 is mounted in the circular recessed chamber 11 of the heat sink body 1 according to any manner well known in the art, the cover plate 2 is covered on the heat sink body 1, and then the countersunk holes 22 of the cover plate 2 are respectively fastened to the mounting holes 13 of the heat sink body 1 by a plurality of respective screws 4.

Figure 3:
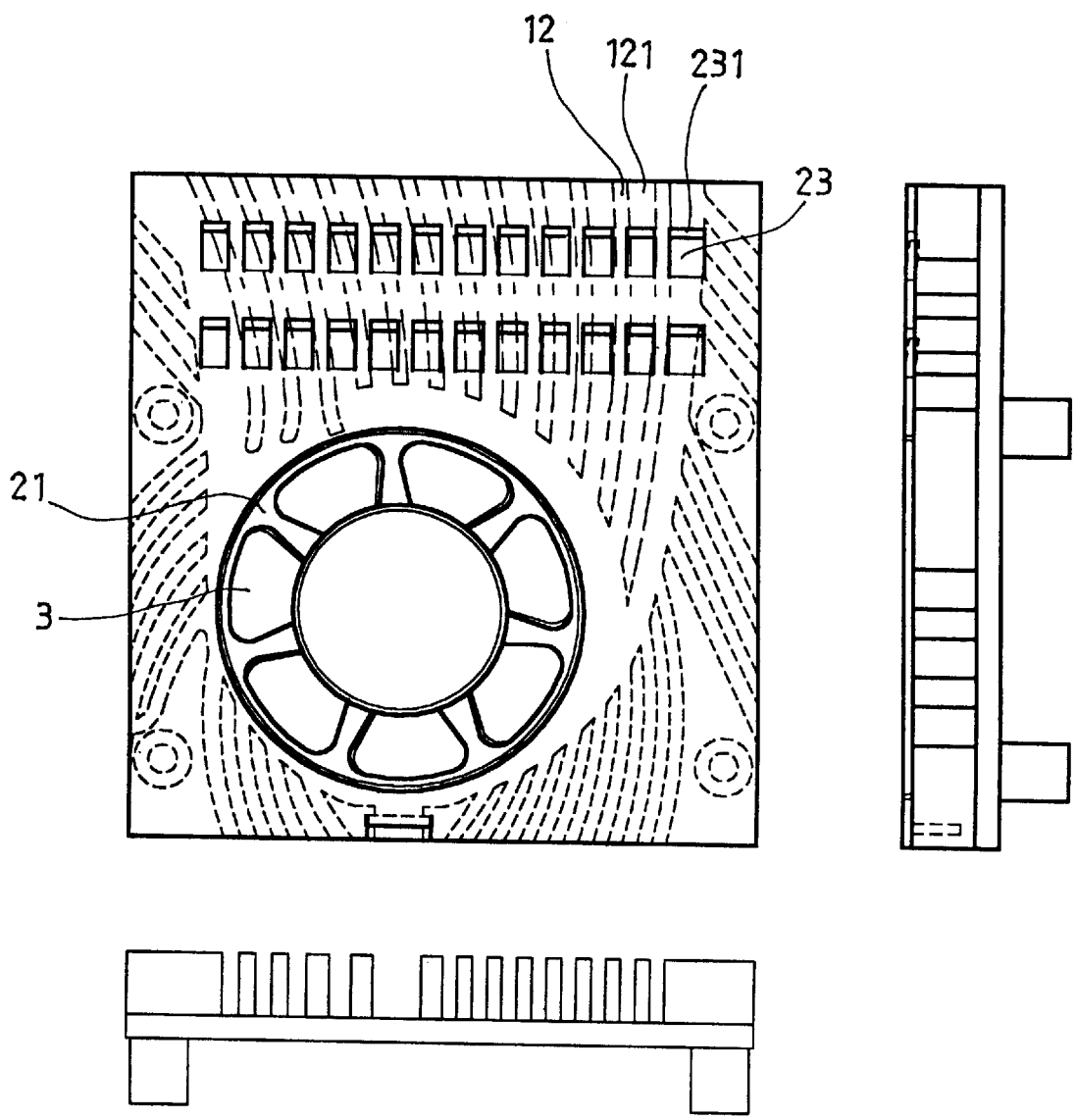
FIG. 3 are top plan and side elevational views of the present invention.
Figure 4:
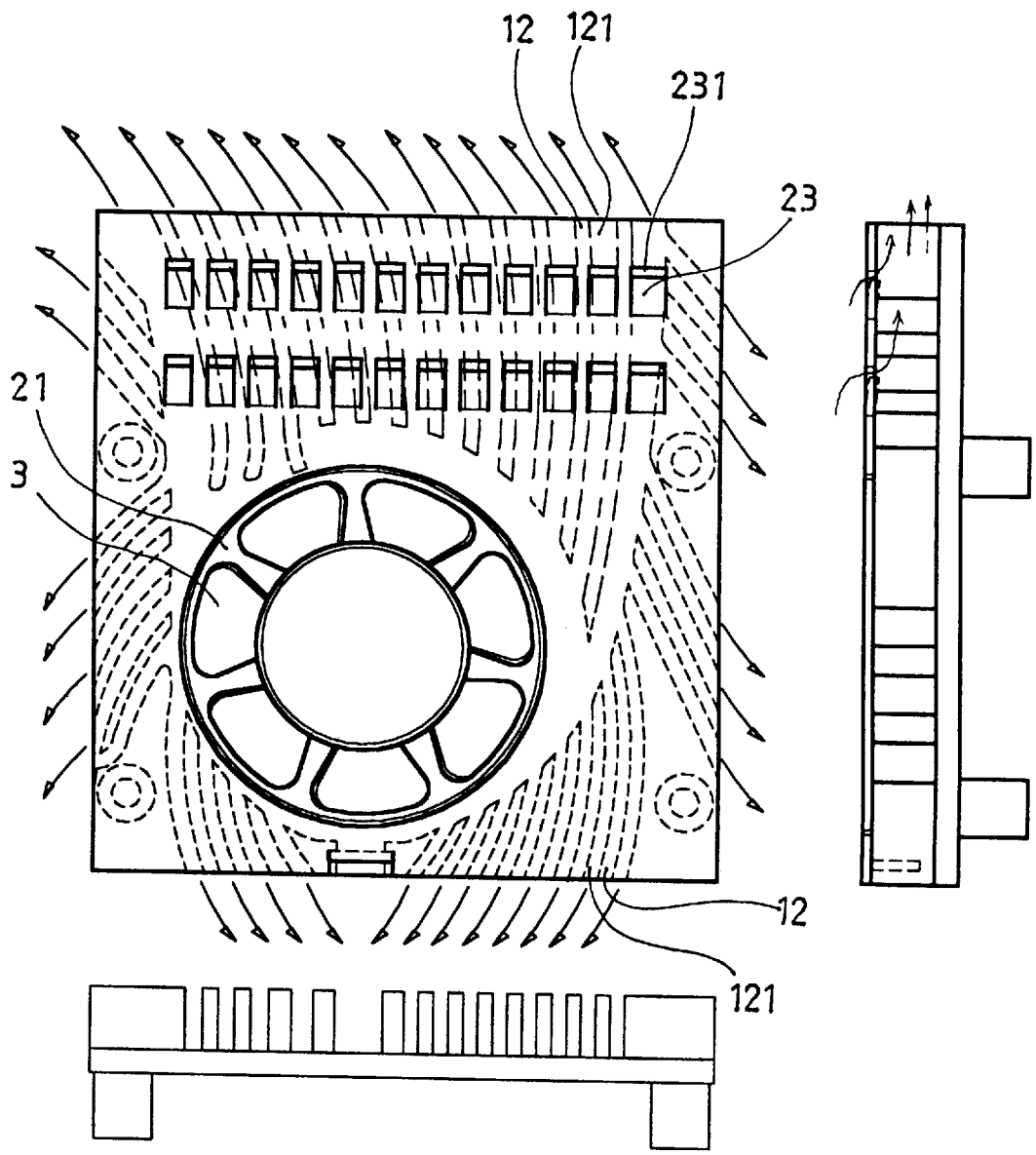
FIG. 4 is similar to FIG. 3 but showing currents of air driven out of the heat sink body.

Referring to FIGS. 3 and 4, when the fan 3 is started, currents of air are created by the fan 3 and driven out of the circular recessed chamber 11 through the spiral air passages 121 defined by radiating fins 11, and at the same time outside air is guided by strips 23 and pulled through the air vents 231 into the inside of the heat sink body 1 and then forced out of the heat sink body 1 through the spiral air passages 121.

It is to be understood that the drawings are designed for purposes of illustration only, and are not intended as a definition of the limits and scope of the invention disclosed.

What the invention claimed is:

1. A CPU heat sink assembly comprising:

(a) a heat sink body for attachment to a CPU for dissipating heat therefrom, the heat sink body including a circular recessed chamber eccentrically positioned at a top side thereof, for receiving a fan receiving within the recessed chamber for blowing air, a plurality of fins radiating spirally outwardly from the recessed chamber and defining a plurality of spiral air passages therebetween for directing air blown by the fan outwardly from the circular recess and dissipating heat from the fins; and (b) a cover plate mounted on the heat sink body, the cover plate including a circular opening positioned over the recessed chamber, a plurality of air vents, each air vent being aligned with a spiral air passage, and each air vent further including a sloping wind guide strip respectively projected downwardly for guiding exterior air through the air vent and into the aligned air passage.

* * * * *